(12) United States Patent
Blomquist

(10) Patent No.: US 7,775,062 B2
(45) Date of Patent: *Aug. 17, 2010

(54) MODULAR COOLING SYSTEM

(76) Inventor: Mike Blomquist, 1123 Antelope Pl., Newbury Park, CA (US) 91320

( * ) Notice: Subject to any disclaimer, the term of this patent is extended or adjusted under 35 U.S.C. 154(b) by 0 days.

This patent is subject to a terminal disclaimer.

(21) Appl. No.: 12/540,342

(22) Filed: Aug. 12, 2009

(65) Prior Publication Data

US 2010/0064718 A1  Mar. 18, 2010

Related U.S. Application Data

(63) Continuation-in-part of application No. 12/211,060, filed on Sep. 15, 2008.

(51) Int. Cl.
*F25D 23/12* (2006.01)
*F01C 5/00* (2006.01)
*F01C 1/00* (2006.01)

(52) U.S. Cl. .................. 62/259.2; 165/53; 165/80.2; 165/121; 165/104.33; 165/104.34; 418/156; 418/268

(58) Field of Classification Search ............... 165/80.4, 165/47, 53, 80.3, 104.33, 104.34, 12, 80.2; 361/691, 695, 702, 704, 694, 696, 701; 62/259.2; 418/156, 268

See application file for complete search history.

(56) References Cited

U.S. PATENT DOCUMENTS

| | | | | |
|---|---|---|---|---|
| 2,442,783 A | * | 6/1948 | Senn | 416/240 |
| 3,886,764 A | * | 6/1975 | Edwards | 62/401 |
| 4,772,185 A | * | 9/1988 | Hertell | 418/3 |
| 5,188,524 A | * | 2/1993 | Bassine | 418/152 |
| 6,264,450 B1 | | 7/2001 | Woodruff | |
| 6,371,745 B1 | | 4/2002 | Bassine | |
| 6,464,459 B2 | * | 10/2002 | Illingworth | 415/208.2 |
| 6,567,267 B1 | * | 5/2003 | Wang | 361/695 |
| 6,616,094 B2 | * | 9/2003 | Illingworth | 244/12.1 |
| 6,987,669 B2 | * | 1/2006 | Chen | 361/695 |
| 7,331,378 B2 | | 2/2008 | Bhatti et al. | |
| 7,411,789 B2 | | 8/2008 | Nishimura | |
| 7,637,727 B2 | * | 12/2009 | Hyodo | 425/46 |
| 2001/0040062 A1 | * | 11/2001 | Illingworth | 416/185 |
| 2002/0047071 A1 | * | 4/2002 | Illingworth | 244/199 |
| 2010/0065258 A1 | * | 3/2010 | Blomquist | 165/104.34 |

OTHER PUBLICATIONS

Attila Aranyosi et al., Compact Air-Cooled Heat Sinks for Power Packages, IEEE Transactions on Components, Packaging, and Manufacturing Technology—Part A, Dec. 1997, pp. 442-451. vol. 20, No. 4, IEEE, USA.

* cited by examiner

*Primary Examiner*—Ljiljana (Lil) V Ciric
(74) *Attorney, Agent, or Firm*—Ocean Law; Paul D. Chancellor

(57) ABSTRACT

A modular cooling system includes a positive displacement compressor and a microchannel heat exchanger for cooling a heat generating device such as a semiconductor.

5 Claims, 12 Drawing Sheets

MODULAR COOLING SYSTEM

PRIORITY CLAIM

This application is a continuation in part of U.S. patent application Ser. No. 12/211,060 filed Sep. 15, 2008 and entitled MODULAR COOLING SYSTEM.

BACKGROUND OF THE INVENTION

1. Field of the Invention

The present invention relates to a cooling system incorporating a gas compressor and a heat exchanger. In particular, heat absorbed by a gas provides a cooling effect.

2. Discussion of the Related Art

Heat transfer components and in particular heat exchangers have largely been designed for cooling large and/or mechanical items. Such systems have in recent years been adapted to other uses including cooling electronics devices. These adaptations generally have only specialized uses and fail to deliver the performance of systems designed from the start to solve a particular class of cooling problems. The present invention is directed to solving these and other problems associated with cooling items including small and/or non-mechanical items.

SUMMARY OF THE INVENTION

A modular cooling system comprises a gas compressor and a gas cooled microchannel heat exchanger interconnected by a pressurized gas conduit.

In an embodiment, an energy efficient modular cooling system comprises a positive displacement compressor for pressurizing a gas to a pressure of about 0.5 to 14 pounds-force per square inch gauge pressure (psig), a compressor hub having an axis of rotation arranged eccentrically with respect to a compressor circumferential wall, the hub coupled to a plurality of blades with respective blade roots, the distance between the root end of each blade and the hub axis remaining substantially constant during compressor operation and the distance between each blade tip and the hub axis cyclically changing in a substantially oscillatory fashion during compressor operation. A heat exchanger is physically coupled to a semiconductor device, the heat exchanger incorporating a plurality of channels suitable for transporting the pressurized gas, each channel having an inlet, an outlet and at least one inside dimension in the range of about 5 to 50 one thousandths of an inch, a first manifold in fluid communication with the channel inlets and the first manifold operative to supply pressurized gas from the compressor to the channel inlets.

An embodiment includes a compressor mounted filter frame and a filter coupled to the frame, the filter operative to restrict passage of contaminants with a mean diameter of about 25 one thousandths of an inch and greater, a collector in fluid communication with the channel outlets, a conduit in fluid communication with the collector and the conduit operative to transport gas exhausted from the heat exchanger across a physical boundary separating two spaces, one of which is a temperature controlled space suited for human occupancy.

An embodiment includes articulated blade attachments at respective blade roots and a preferential weighting of the blades toward respective blade tips operative to increase an outlet pressure of the compressor.

An embodiment includes a heat exchanger cover assembly including a cover, the manifold and the collector and a plurality of fins extending between the cover and a base and forming the plurality of channels.

An embodiment includes a plurality of cavities, each cavity formed by opposed faces of adjacent blades, an outer hub surface between the roots of the adjacent blades and an inner surface of the circumferential wall between seals the adjacent blades make with said inner surface, the volume of a cavity increasing during a first angular displacement of the hub for ingesting a gas into the cavity via a first aperture in a side wall, the volume of the cavity decreasing during a second angular displacement of the hub for pressurizing said gas and the gas being exhausted from the cavity via a second aperture in a side wall during a third angular displacement of the hub.

BRIEF DESCRIPTION OF THE DRAWINGS

The present invention is described with reference to the accompanying figures. These figures, incorporated herein and forming part of the specification, illustrate the present invention and, together with the description, further serve to explain the principles of the invention and to enable a person skilled in the relevant art to make and use the invention.

DETAILED DESCRIPTION OF THE PREFERRED EMBODIMENTS

The disclosure provided in the following pages describes examples of some embodiments of the invention. The designs, figures, and description are non-limiting examples of certain embodiments of the invention. For example, other embodiments of the disclosed systems and methods may or may not include the features described herein. Moreover, disclosed advantages and benefits may apply to only certain embodiments of the invention and should be not used to limit the disclosed inventions.

Figure 1A:
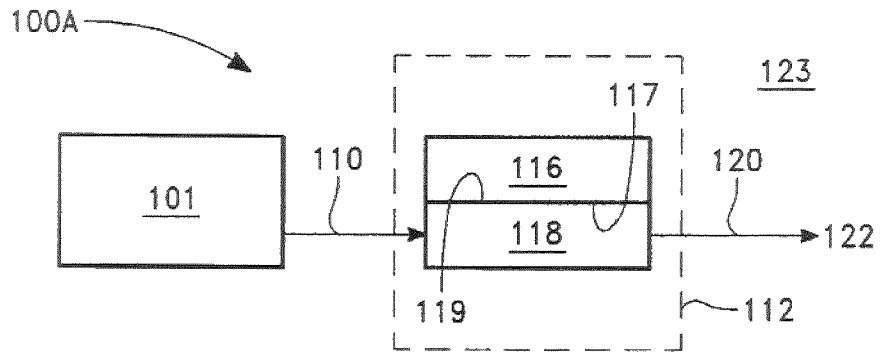
FIG. 1A is a first schematic of a cooling system in accordance with the present invention.

FIG. 1A shows a cooling system in accordance with the present invention 100A. A heat exchanger or cooler 118 has a heat exchanger surface 117 and an item or device to be cooled 116 has a surface 119. Heat transfer from the item surface to the heat exchanger surface cools the item. In an embodiment, a path for conduction heat transfer exists between the item and heat exchanger surfaces. And, in an embodiment, a physical coupling of the cooler and the item to be cooled establishes contact between the heat exchanger surface and the item surface, with or without an interposed heat transfer aid such as a heat transfer compound. In these and similar embodiments, heat transfer between the surfaces is primarily via conduction and the item to be cooled is cooled when heat is transferred from the item surface to the heat exchanger surface.

Heat is removed from the heat exchanger 118 primarily via convective heat transfer to a gas passing through the heat exchanger. The gas is supplied to the heat exchanger from a pressurized gas source 101 via a first tube, pipe, conduit or passage ("conduit") 110. A second conduit 120 contains gas leaving the heat exchanger. In some embodiments at least some of the gas leaving the heat exchanger is exhausted via a first gas exhaust 122 to the surroundings 123 and in some of these cooling systems the surroundings are physically separated from a conditioned space enclosing the item to be cooled 112. In some embodiments, all or portions of the pressurized gas source are remote from the item to be cooled.

In various embodiments, the exhaust 122 and gas supply 102 (see FIG. 1B) are located in any of a housing enclosing the item to be cooled 116, in a conditioned space such as space 112 and external to the housing and conditioned space such as out-of-doors. In an embodiment, the exhaust 122 is located out-of-doors and the gas supply 102 is drawn from a conditioned space. And, in an embodiment, the heat rejected by the item to be cooled 116 is rejected to the out-of-doors.

In some embodiments, the gas mentioned above is air. However, in various embodiments other gases with physical properties suited to the application, including thermal conductivity and vapor pressure, are used. As indicated by the application, other gases to be considered include nitrogen, argon, carbon dioxide, helium and mixtures of two or more of these gases. As such, references to gas herein should be understood to include air and other suitable gases known to persons of ordinary skill in the art.

Figure 1B:
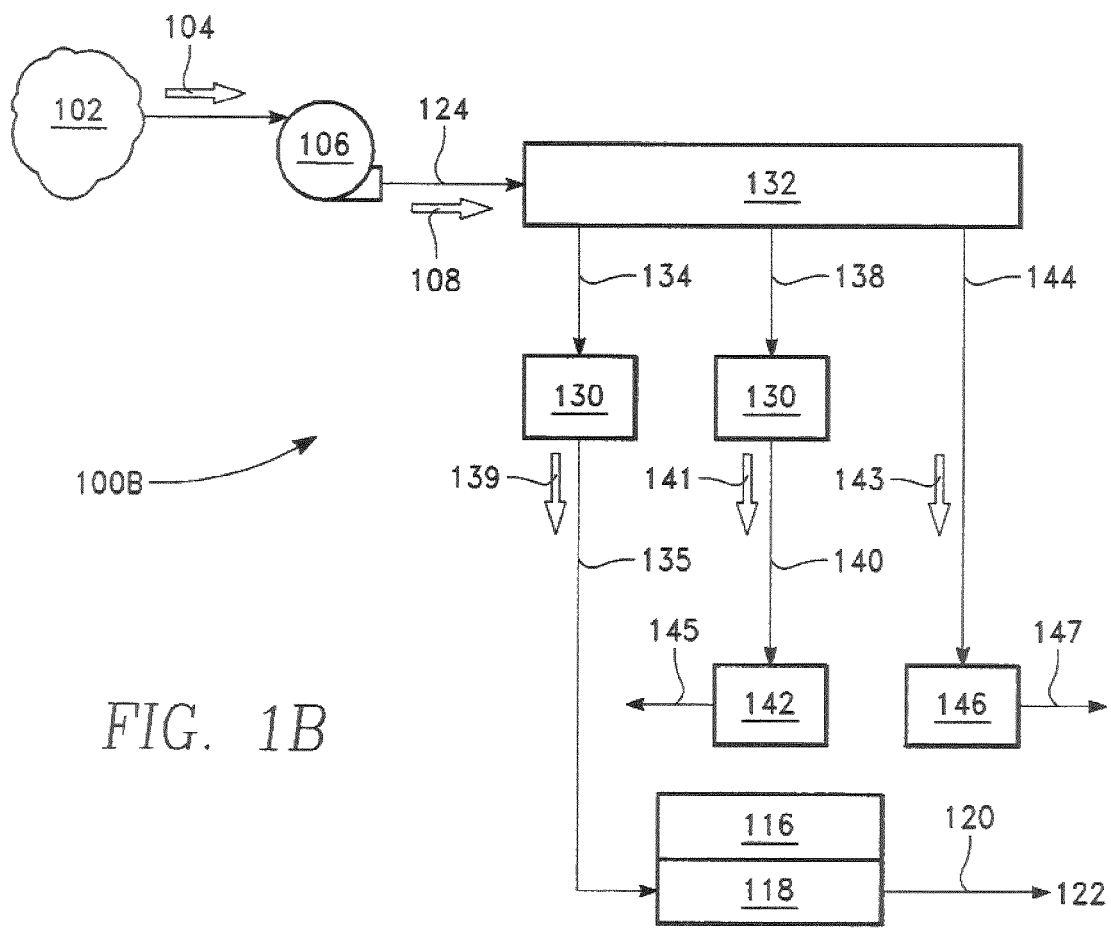
FIG. 1B is a schematic of an embodiment of the cooling system of FIG. 1A.

FIG. 1B shows an embodiment 100B of the cooling system of FIG. 1A including, among other things, gas flow control components. A chamber or manifold 132 receives gas 108 via a third conduit 124 from a gas pressurizing device 106, such as a positive displacement compressor or a non-positive displacement compressor, for example a centrifugal compressor. The gas pressurizing device takes suction 104 via a suction conduit 105 from a gas supply 102, such as the atmosphere in an open system and a gas return conduit in a closed system.

In various embodiments, selected gas flows from the manifold are controlled by valve(s) 130. In an embodiment, a first gas flow to a heat exchanger 139 is controlled by a valve 130 supplied by a fourth conduit 134 leading from the manifold and exhausting to a fifth conduit 135 leading to the heat exchanger 118. Suitable valves include manual valves and valves capable of being automatically operated such as solenoid, servo-operated valves and piezoelectric valves. In some embodiments a second flow supplied from the manifold 141 is controlled by a valve 130 interposed between a sixth conduit 138 leading from the manifold and a seventh conduit 140 leading to a second device to be cooled 142 which has a second device gas exhaust 145. And, in some embodiments, a third flow supplied from the manifold 143 via a seventh conduit 144 interconnecting the manifold and a third device to be cooled 146 has a third device gas exhaust 147.

Figure 1C:
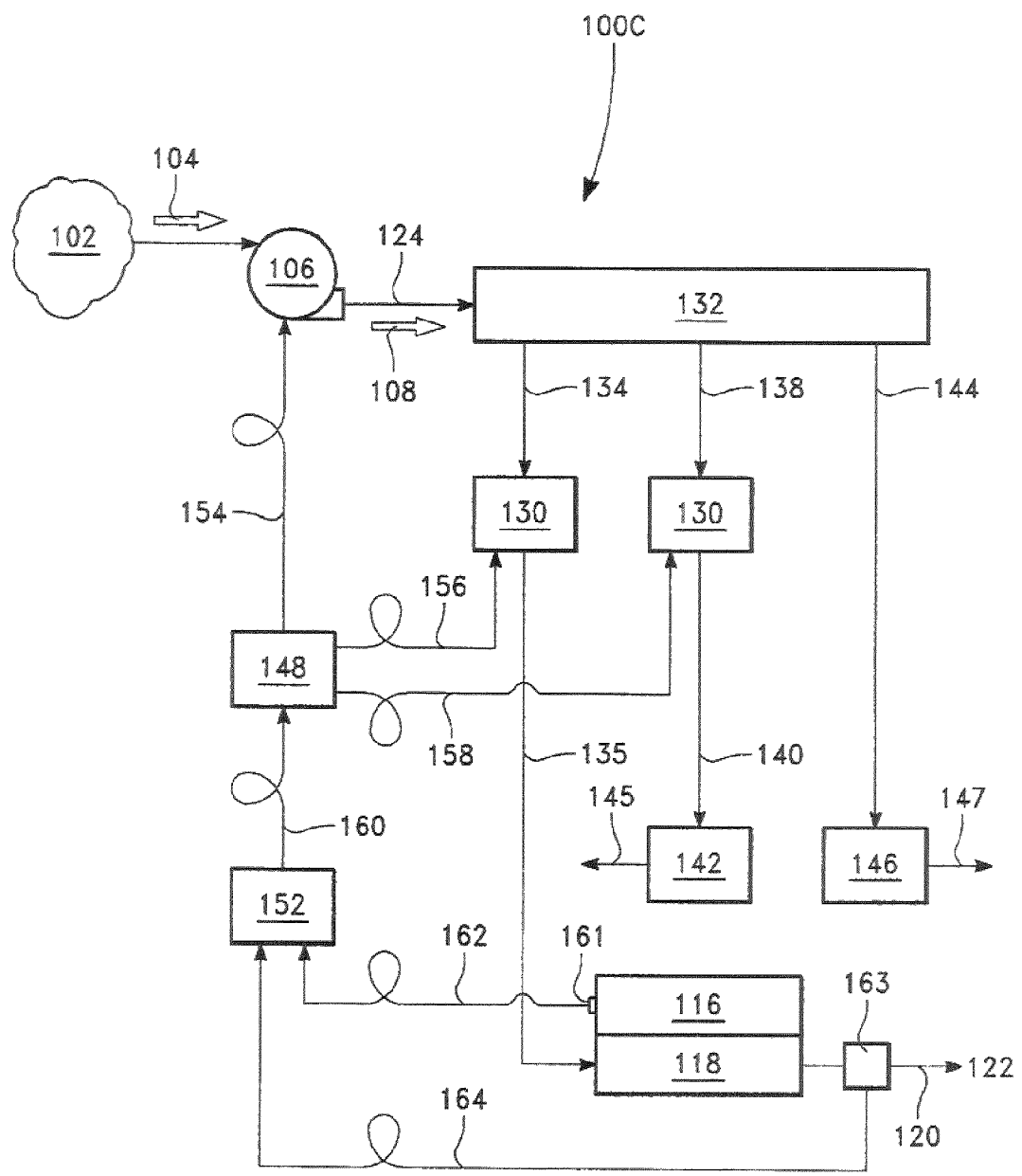
FIG. 1C is a schematic of an embodiment of the cooling system of FIG. 1A.

FIG. 1C shows an embodiment 100C of the cooling system of FIG. 1B including, among other things, a controller for automating flow control. Here, a controller such as a digital controller, analog controller or analog and digital hybrid controller 148 receives one or more temperature signals 160. In various embodiments, the controller transmits one or more signals to control valves 130 via valve signal lines 156, 158 and to the gas compressor via compressor signal line(s) 154. Temperatures sensed provide control feedback such as feedback to control cooling gas flowrate 108 and to indicate unsafe operating conditions. In various embodiments, temperature sensors used include a heat exchanger exhaust temperature sensor 163 and an item temperature sensor 161. Among other things, such sensors and controllers enable response to near instantaneous, past and/or predicted temperature measurements to vary item cooling rates. For example, gas flow to the manifold 108 may be controlled by controlling shaft speed of a gas supply compressor 106. And, for example, gas flow through control valves 130 may be controlled by controlling respective valve actuators.

For controlling gas flow to limit temperature excursions of the device to be cooled, temperature measurements for feedback controls should be made at suitable locations and in particular at locations indicating the temperature of the device to be cooled. These may be direct measurements of the temperature of the device itself, such as measurements made with an embedded thermocouple or thermistor 161. Also suited to this purpose are indirect measurements, for example a measurement made of the temperature of the gas leaving the heat exchanger 163.

In an embodiment, first signal line 162 interconnects a sensor for measuring the temperature of the device to be cooled 161 with the controller 148 via an optional signal conditioning module 152 such as that used in the temperature measuring circuit of fan speed controls associated with a modern microprocessor application. The temperature measuring device or sensor may be a contacting or embedded device like a thermocouple, temperature sensing semiconductor or thermistor, or it may be a non-contacting device such as an infrared sensor or another sensor known to persons of ordinary skill in the art. And in some embodiments a second signal line 164 interconnects a temperature measuring device indicating the temperature of gas leaving the heat exchanger with the controller 148 via the optional signal conditioning module 152.

In an embodiment, the gas pressurization device 106 is a compressor utilizing blades coupled to a rotatable shaft, the centerline of the shaft being in eccentric relationship with a circumferential boundary of a compressor chamber enclosing the blades. In some embodiments, the blades interact with a blade hub driven by the rotatable shaft and the blade-hub interaction is substantially characterized by resilient blade flexure near a blade-hub interface ("root flexing blades"). In other embodiments, the blades interact with a blade hub driven by the rotatable shaft and the blade-hub interaction is more substantially characterized by an articulating action near a blade-hub interface ("root articulating blades"). For some root flexing embodiments and for some articulating action embodiments, a plurality of blades have respective blade roots that are substantially stationery with respect to a hub and blade tips that oscillate, cyclically moving toward and away from respective blade roots.

Figure 2A:
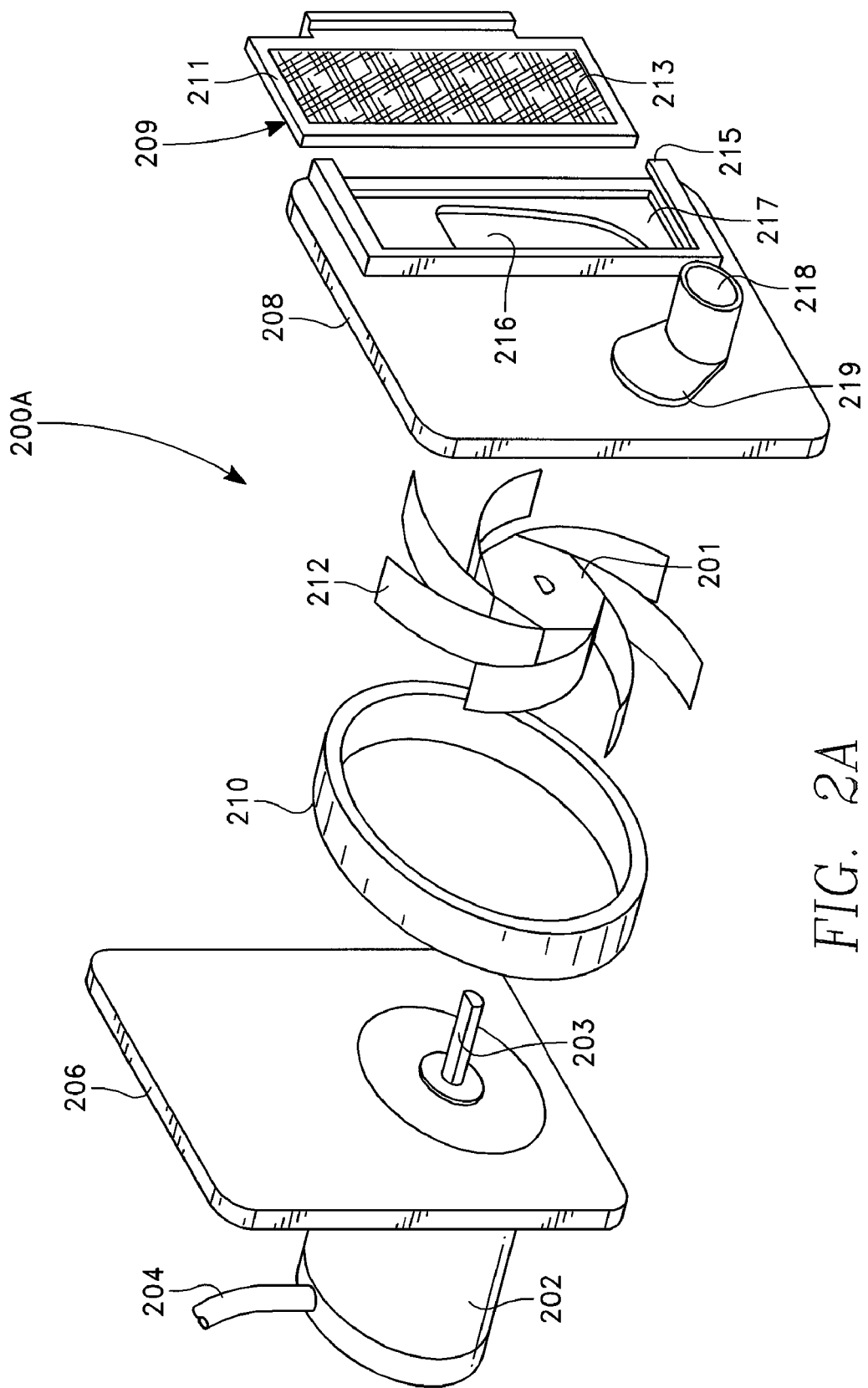
FIG. 2A is an exploded diagram of a first compressor for use with the cooling system of FIG. 1A.

In an embodiment, the gas pressurization device 106 is a positive displacement compressor utilizing root flexing blades that are integral with and/or in resilient relationship with a hub. FIG. 2A shows such a flexing blade compressor 200A.

In the flexing blade compressor, a hub 201 with three or more fixed blades 212, such as a bladed hub formed by adhering multiple parts, extrusion, casting or machining a monolithic piece of stock material, is substantially enclosed by compressor chamber walls including a circumferential wall 210 interposed between first 206 and second 208 side walls. A prime mover such as an electric motor 202 powered by an electricity source 204 is mechanically coupled to the hub 201 such that rotation of a motor shaft 203 causes the hub to rotate, operating the compressor. Some embodiments incorporate a gas or air filter 209 such as a filter including a filter frame 211 holding a filter media 213, the frame for insertion in a filter rack 215 of a sidewall such as the second sidewall and the frame extending over an inlet aperture 216.

Suitable filter media 213 includes filter media for trapping particulate matter. For example, filter media includes that designed to resist the passage of particulate matter of a size likely to lead to heat exchanger blockages. In an embodiment, the filter media is designed to resist passage of particulate matter having a mean diameter greater than a fraction of a minimum channel dimension. In an embodiment, the filter media is designed to resist the passage of particulate matter having a mean diameter greater than about one-half of a minimum channel dimension.

Figure 2B:
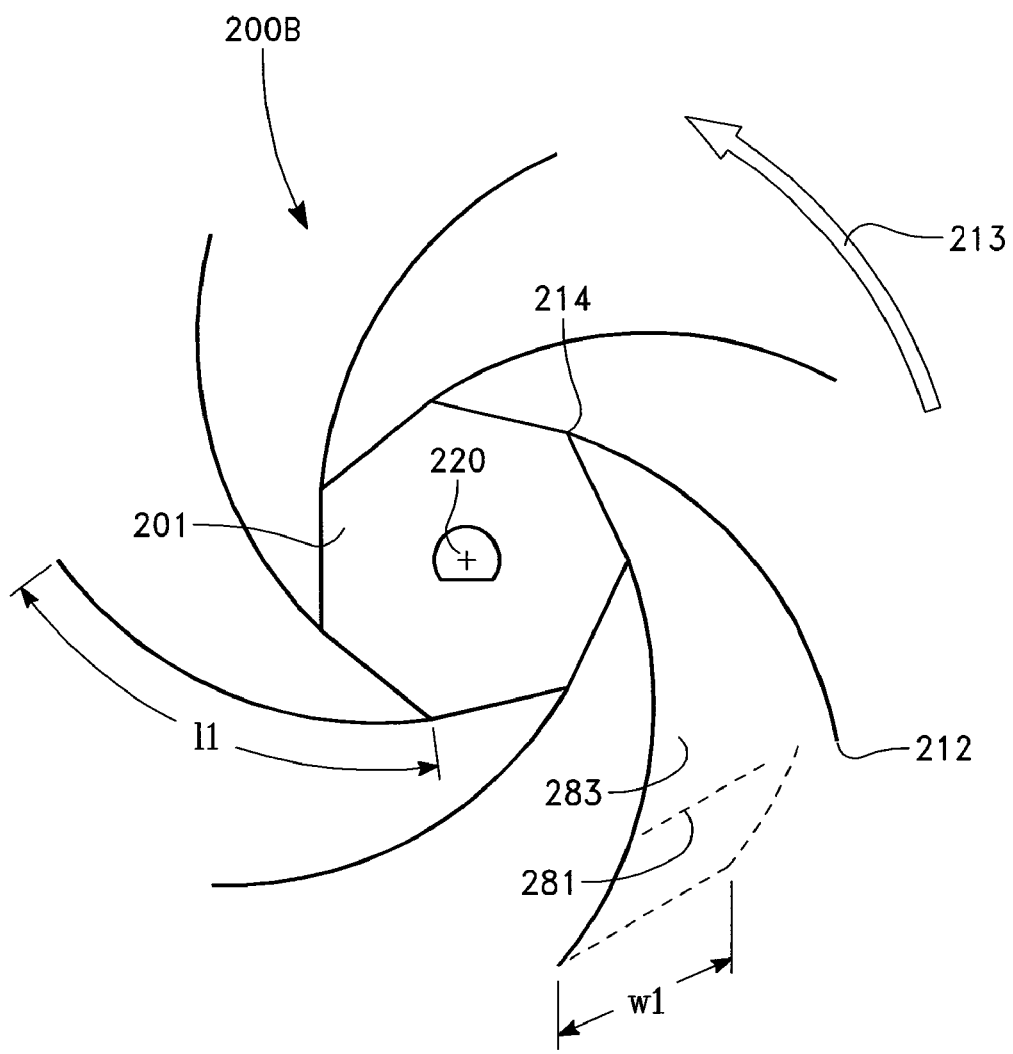
FIG. 2B is a diagram of a first bladed hub of a compressor of the cooling system of FIG. 1A.
Figure 2C:
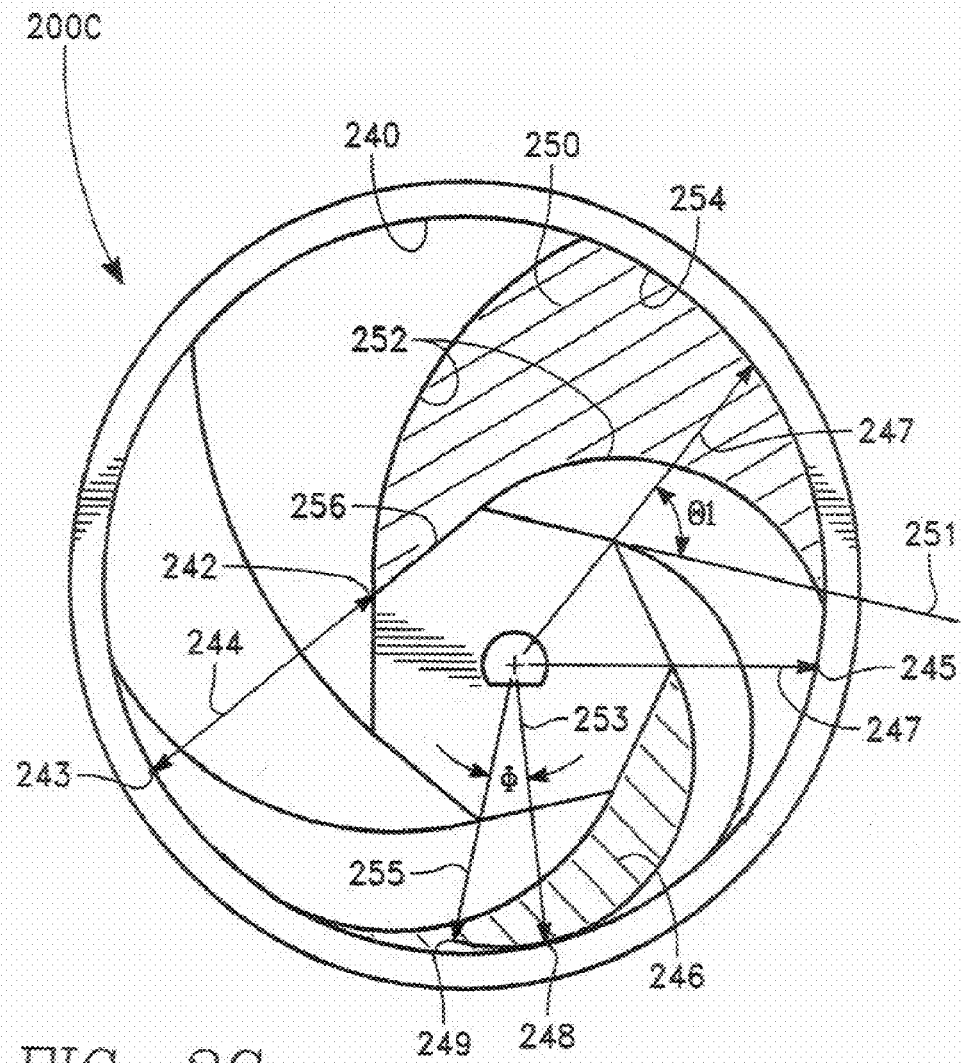
FIG. 2C is a diagram of a first bladed hub inserted in a circumferential wall of a compressor of the cooling system of FIG. 1A.

FIG. 2B shows an embodiment of a flexible blade compressor's bladed hub 200B. FIG. 2C shows a bladed hub inserted in a flexible blade compressor circumferential wall 200C.

The blades extend from the hub at respective blade roots 214 and each blade forms a root angle $\Theta 1$ between a radial root line 247 projected from the hub's axis of rotation 220 through the root 214 and a line tangent to the blade near the blade root 251. Similarly, radial seal and tip lines 253, 255 are formed by radial lines projected from the hub's axis of rotation through blade seals 248 and tips 249 respectively defining an angle $\phi$.

In various embodiments, installation of the bladed hub 200B into the compressor chamber causes further bending of a plurality of blades 212 increasing the related angles $\Theta 1$. Here, the blade tip 249 trails, with respect to the hub's 201 direction of rotation 213, the projection of the root line on the inner surface of the circumferential wall 245. And, in some embodiments, small clearances discussed further below result in the end of the tip line 249 trailing, with respect to the direction of hub rotation, the end of the seal line 248. In particular, smaller clearances correspond in these embodiments to increases in the magnitude of the angle $\phi$.

The hub's rotational axis 220 is substantially normal to a side wall and eccentrically arranged with respect to an inner surface of the circumferential wall 240 such that 1) the shortest distance or clearance 244 between a point on the periphery of the hub 242 and the circumferential wall inner surface 243 varies as the hub rotates and 2) during a complete revolution of the hub the shortest distance establishes both minimum and maximum clearances.

The blades have a length l1 that is greater than the maximum clearance mentioned above and extend between the hub 201 and an inner surface of the circumferential wall 240 forming a plurality of cavities 250. Each cavity is defined by 1) opposed faces of adjacent blades 252, 2) a hub surface extending between the roots of the adjacent blades 256 and 3) an inner surface of the circumferential wall extending between seals the adjacent blades make with the circumferential wall inner surface 254. Cavity volumes are substantially equal to their cross-sectional area multiplied by a depth substantially equal to the width or an average width w1 of a blade.

For a particular cavity, rotation of the hub varies cavity volume from a maximum value 250 to a minimum value 246 and so the volume of the gas within the cavity. As indicated here, a blade flexes (i.e., $\Theta 1$ increases) as it encounters smaller clearances. And, in some embodiments, the region of a blade contacting the inner surface eventually moves away from the blade tip 249 toward the blade root 214 due to curling of the blade(s) forming the smallest cavity(s). For example, during a one angular displacement of the hub 201, a particular cavity's volume expands; during another angular displacement of the hub the cavity's volume contracts. And, as described more fully below, during different and/or overlapping angular displacements gas is drawn into and expelled from the cavity.

Gas inlet and outlet structures are formed in parts of the compressor chamber. In one embodiment at least one such structure is formed in the circumferential wall. (See for example the description of FIGS. 3D,E). In another embodiment, at least one such structure is formed in a side wall. In the embodiment of FIG. 2A, an inlet structure 217 formed in a side wall 208 defines an aperture 216 allowing expanding chambers in fluid communication with the inlet structure to ingest a gas. In some embodiments, the aperture is slot-like in shape. Similarly, an outlet structure 219 formed in a side wall 208 includes an outlet nozzle 218 such that contracting chambers in fluid communication with the outlet structure expel a gas through the outlet nozzle.

In various embodiments, the compressor chamber parts and bladed hub are made of one or materials suited to the application such as polymers including plastics and metals including steel, nickel, copper, aluminum, titanium and alloys including one or more of these metals. In some embodiments, the integral bladed hub is made of HDPE or a similar polymer. And, in some embodiments, the bladed hub is made of a material resistant to flexural fatigue such as a fatigue resistant polymer; for example, a thermoplastic polyester elastomer (TPE-E), Arnitel® offers resistance to flexural fatigue over a wide range of temperature conditions.

Figure 3A:
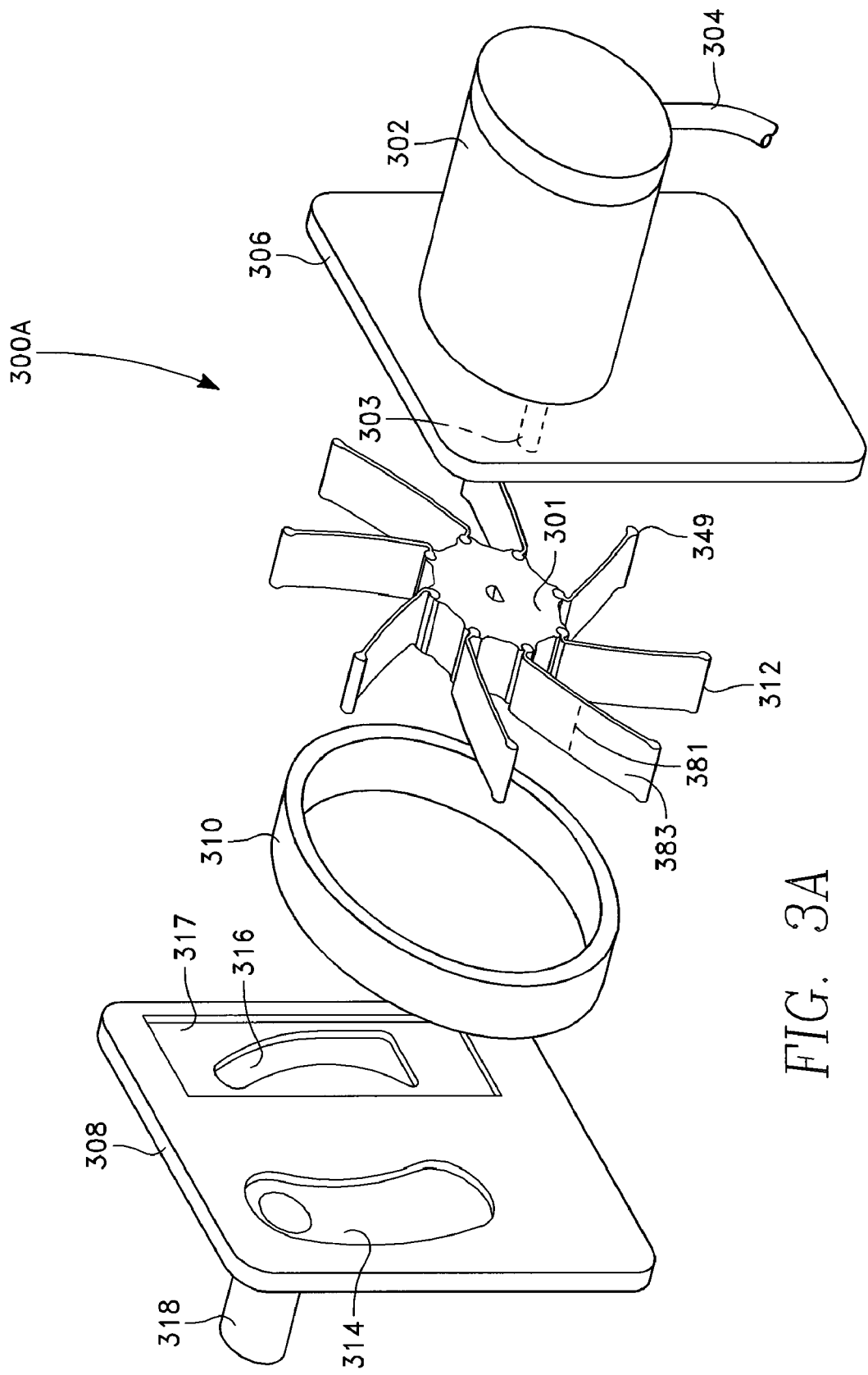
FIG. 3A is an exploded diagram of a second compressor for use with the cooling system of FIG. 1A.

In an embodiment, the gas pressurization device 106 is a positive displacement compressor utilizing root articulating blades that are not integral with a hub and that do not substantially flex at respective blade roots during compressor operation. FIG. 3A shows such an articulating blade compressor 300A.

In the pivoting blade compressor, a hub 301 is fitted with three or more articulated blades 312 to form a bladed hub. The bladed hub is substantially enclosed by compressor chamber walls including a circumferential wall 310 interposed between first 306 and second 308 side walls. A prime mover such as an electric motor 302 powered by an electricity source 304 is mechanically coupled to the hub such that rotation of a shaft of the motor 303 causes the hub to rotate, operating the compressor.

Figure 3B:
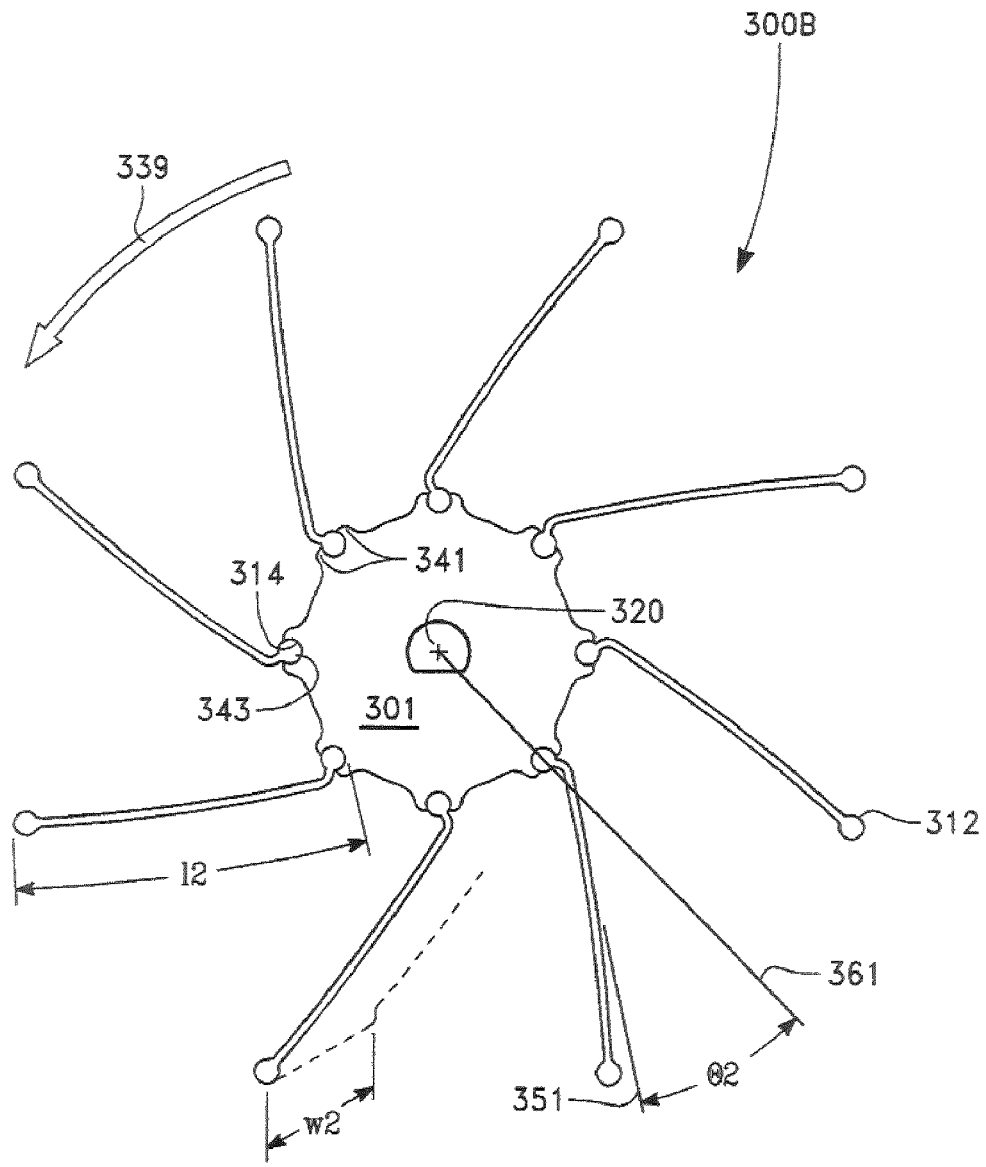
FIG. 3B is a diagram of a second bladed hub of a compressor of the cooling system of FIG. 1A.

FIG. 3B shows an embodiment of a pivoting blade hub 300B. The blades extend from the hub at respective blade roots 314. In various embodiments, a point of articulation moves along the length of the blade. In the embodiment shown, the point of articulation is at the blade root. In some embodiments, the point of articulation functions as a pinned connection such as a hinge. In particular, a semicircular setting 341 receives a matching circular insert that is at the proximate end of a blade 343. In various embodiments, ball-socket, hinge, pinned and other suitable joints including combinations of any of these couple blades to the hub are used.

Figure 3C:
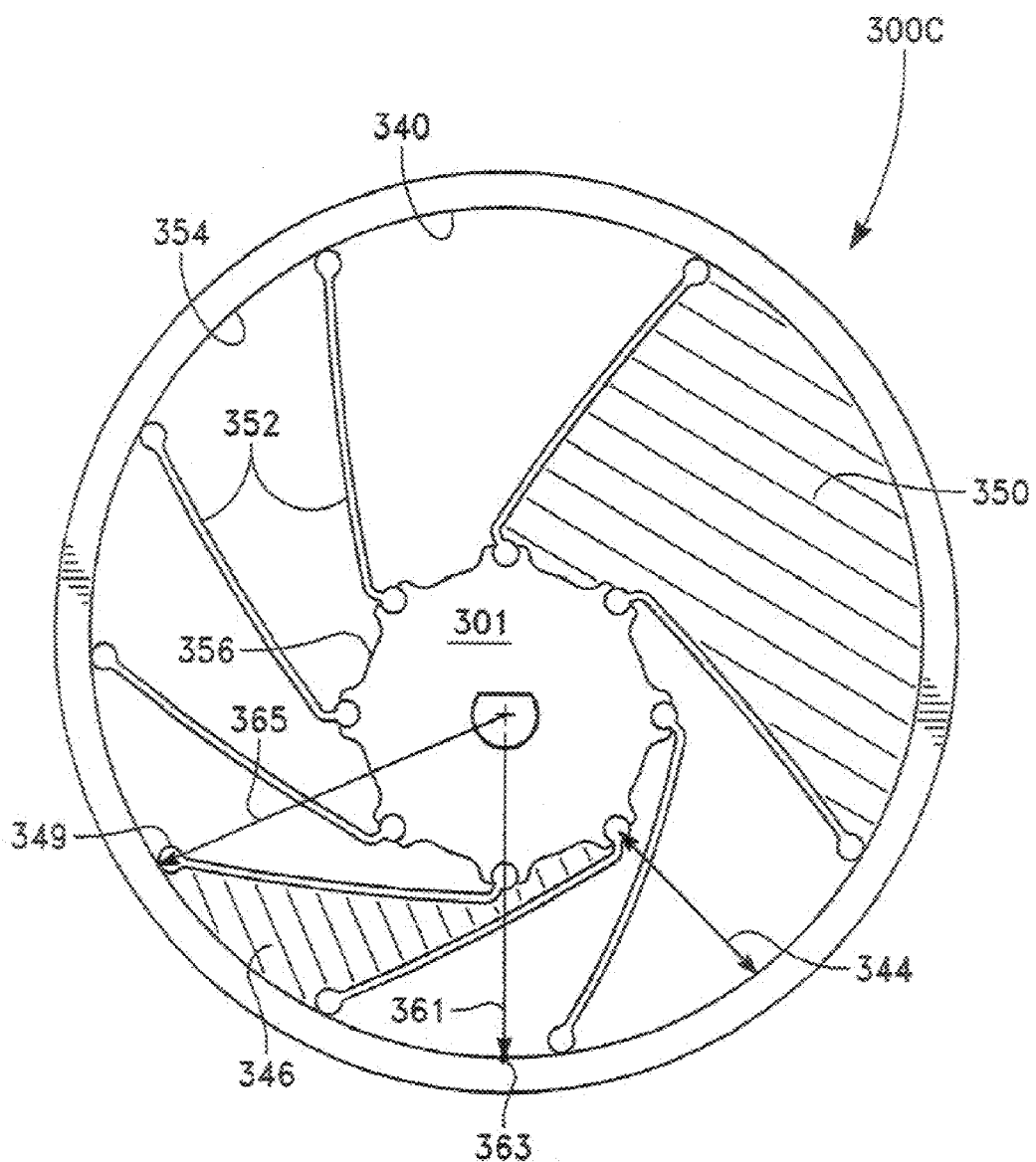
FIG. 3C is a diagram of a second bladed hub inserted in a circumferential wall of a compressor of the cooling system of FIG. 1A.

FIG. 3C shows a pivoting blade hub inserted in a compressor circumferential wall 300C. When a blade's tip 349 contacts the inner surface of the circumferential wall 354, the blade 312 extends from a respective blade root forming an angle $\Theta 2$ between a line tangent to the blade near the blade root 351 and a radial root line passing through the root and the hub axis 361. Similarly, coincident radial seal and tip lines 365 are formed by radial lines projected from the hub's axis of rotation 320 through blade seals and tips 349 respectively. In an embodiment of the articulating blade compressor, the tip and seal lines are not substantially collocated.

In various embodiments, when the bladed hub 301 is inserted in a compressor circumferential wall 300C and the blade tips 349 contact the inner surface of the circumferential wall 354, the blade tips 349 trail, with respect to the hub's 301 direction of rotation 339, the projection of the root lines on the inner surface of the circumferential wall 363.

The hub's rotational axis 320 is substantially normal to a side wall and eccentrically arranged with respect to an inner surface of the circumferential wall 340 such that 1) the shortest distance or clearance 344 between a blade root 314 and the circumferential wall inner surface 354 varies as the hub 301 rotates and 2) during a complete revolution of the hub the shortest distance establishes both minimum and maximum clearances.

The blades have a length l2 that is greater than the maximum clearance mentioned above and extend between the hub and an inner surface of the circumferential wall forming a plurality of cavities, for example 346, 350. Each cavity is defined by 1) opposed faces of adjacent blades 352, 2) a hub surface extending between the roots of the adjacent blades 356 and 3) an inner surface of the circumferential wall extending between seals the adjacent blades make with the circumferential wall inner surface 354. Cavity volumes are substantially equal to their cross-sectional area multiplied by a depth equal to the width or an average width w2 of a blade.

For a particular cavity, rotation of the hub varies cavity volume from a maximum value 350 to a minimum value 346 and so the volume of the gas within the cavity. As indicated here, a blade articulates (i.e., Θ2 increases) as it encounters smaller clearances. For example, during one angular displacement of the hub, a particular cavity's volume expands; and, during another angular displacement of the hub that cavity's volume contracts. And, during different and/or overlapping angular displacements gas is drawn into and expelled from the cavity.

Figure 3E:
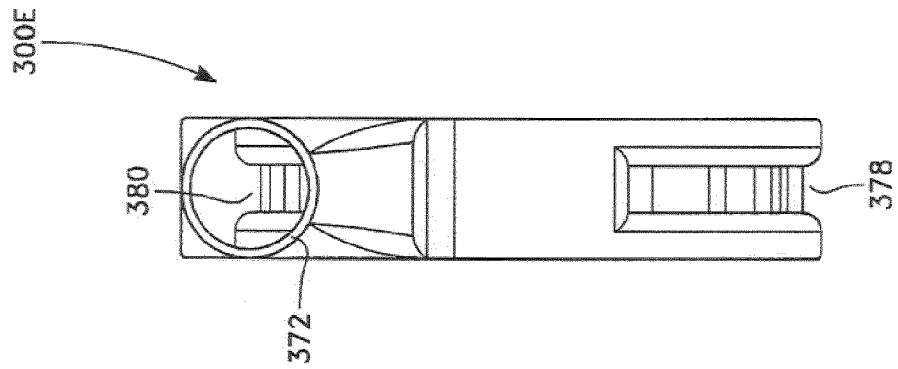
FIGS. 3D-E are diagrams of a bladed hub inserted in a circumferential wall of a compressor of the cooling system of FIG. 1A.
Figure 3D:
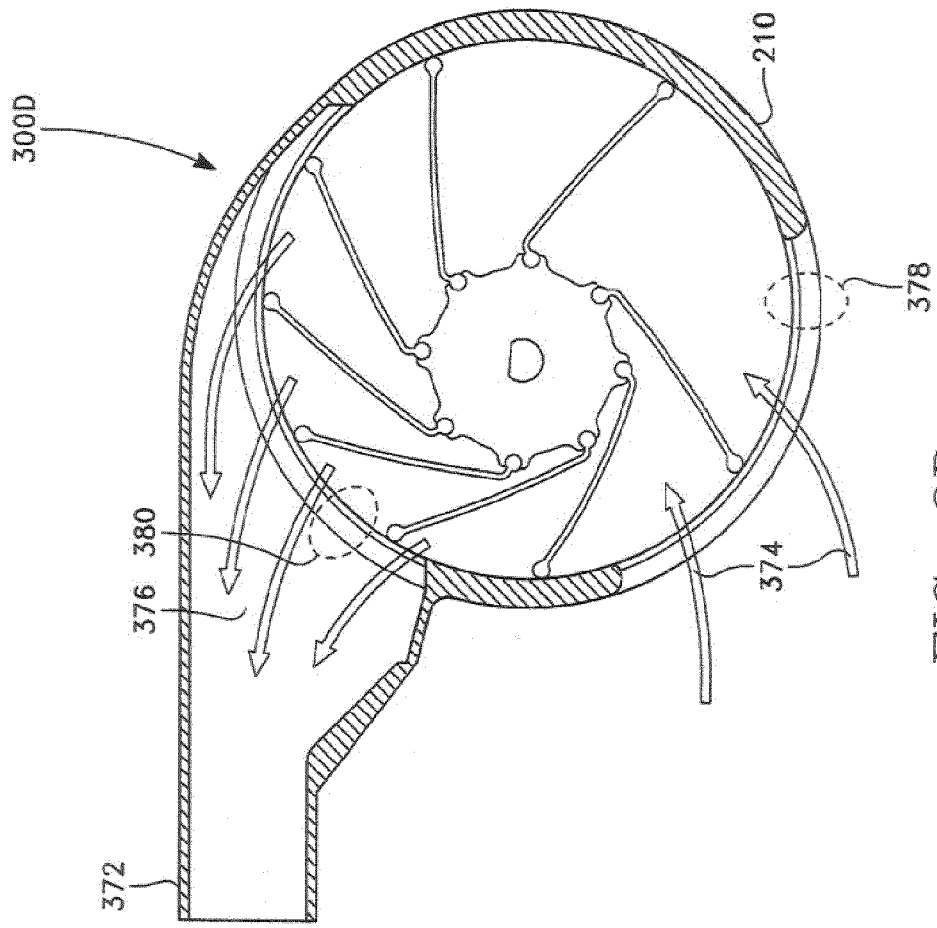

Gas inlet and outlet structures are formed in parts of the compressor chamber. In one embodiment at least one such structure is formed in the circumferential wall. See for example, the embodiment 300D, 300E of FIGS. 3D-E showing a circumferential wall 210 having a circumferential inlet 378 with inlet flows 374 and a circumferential outlet 380 having outlet flows 376 exhausting from an outlet nozzle 372. In another embodiment, at least one such structure is formed in a side wall. For example, in FIG. 3A an inlet structure 317 formed in a side wall 308 defies an aperture 316 allowing expanding chambers in fluid communication with the inlet structure to ingest a gas. In some embodiments, the aperture is slot-like in shape. Similarly, an outlet structure 314 formed in a side wall 308 includes an outlet nozzle 318 such that contracting chambers in fluid communication with the outlet structure expel a gas exiting through the outlet nozzle.

In various embodiments, the compressor chamber parts, blades and hub are made of polymers, metals and/or combinations of the two. In some embodiments, the hub and blades are made of HDPE or a similar polymer. And, in some embodiments, the blades are made from a metal such as stainless steel while the blade's proximate and distal (connecting and sealing) ends are polymers attached to the blade ends.

Various types of heat exchangers may be cooled by gas supplied by the compressor 106. Such heat exchangers include single and multi-flow heat exchangers, primary surface heat exchangers, finned heat exchangers and other heat exchangers suitable for use with the present invention as are known to persons of ordinary skill in the art.

Figure 4C:
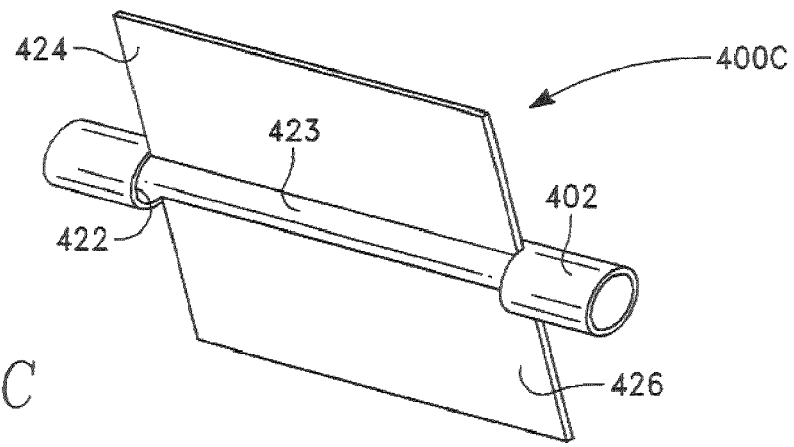
FIGS. 4A-C are diagrams of a first heat exchanger for use with the cooling system of FIG. 1A.
Figure 4B:
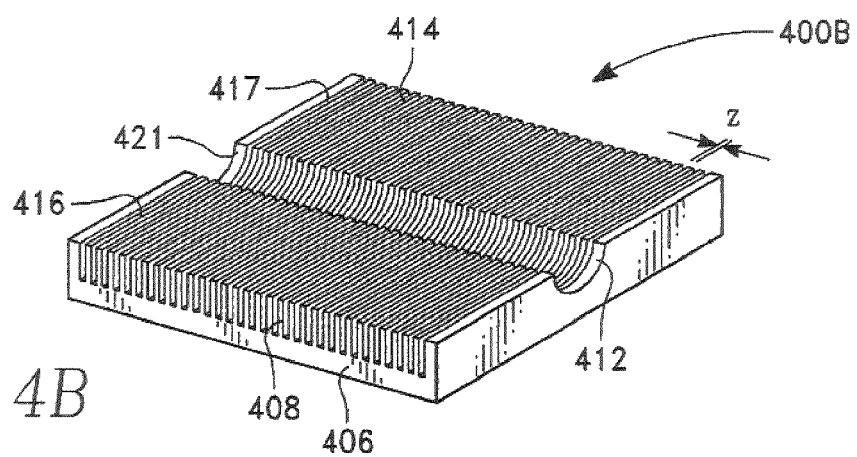
Figure 4A:
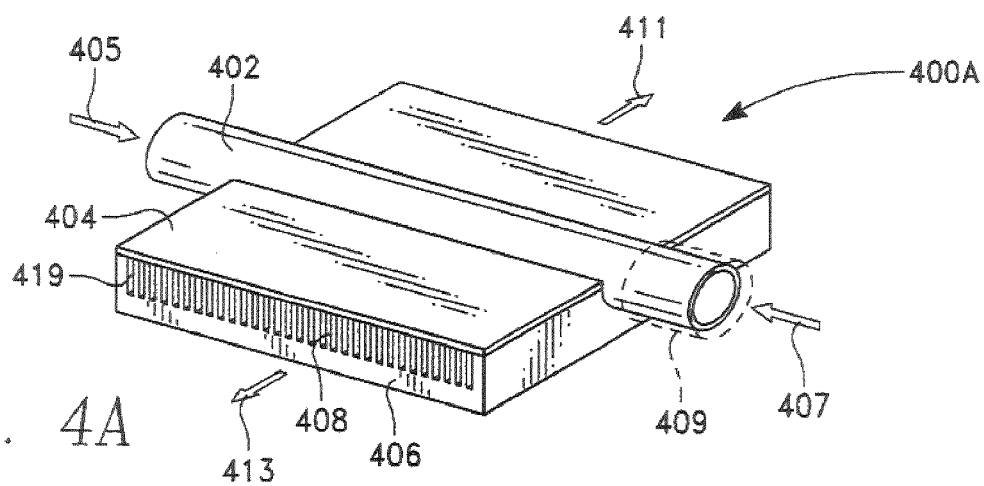

In an embodiment, an opposed flow heat exchanger 400A shown in FIG. 4A cools the item to be cooled 116. In some embodiments, the item to be cooled is a semiconductor device such as a microprocessor. The heat exchanger includes a gas inlet tube 402, a finned base 406, 408 and at least one sealing wall 404.

FIG. 4B shows the finned base 400B including fins 408 extending from an interface structure 406 in a heat conduction path between the item to be cooled 116 and the fins 408. In some embodiments, a block of material suitable for conducting heat, such as a block of aluminum, is worked by sawing, wire EDM, laser cutting, grinding or another suitable method to form the fins. In other embodiments, a finned interface structure may be formed in a molding process. And, in still other embodiments, a plurality of separate fins are joined to the base using one or more methods known in the art such as glues, adhesives and molten materials such as molten metal including new metal and no new metal processes such as soldering and spot welding respectively.

As shown in FIG. 4C the inlet tube 402 abuts two sealing wall portions 424, 426 to form a cover plate 400C. When placed over the fins 408, the cover plate closes the otherwise open channels 417 between the fins such that multiple gas paths are formed between the fins 419.

An inlet channel cutting across the fins 412 provides an entry point for gas 405 leaving a region of the inlet tube 402 where a portion of the tube wall is cut-away to form a gas outlet slot 423. This slot is bounded by opposed inlet tube rim portions 422 arranged for sealing with peripheral portions of the inlet channel 421. One or two gas flows 405, 407 supply gas to the heat exchanger and opposed gas flows exiting the heat exchanger 411, 413 through fin channels to either side of the inlet tube 414, 416. In various embodiments, a cap 409 is used to block either end of the inlet tube where a single gas flow will be used.

To enhance convective heat transfer, a gap "z" between adjacent fins is chosen to disturb the boundary layer commonly found in fluid systems and to thereby improve the convective heat transfer coefficient. The inventor has performed experiments and found that gaps less than about $50/1000$'s of an inch are preferred and that gaps between about 5 and $20/1000$'s of an inch are more preferred.

Figure 5A:
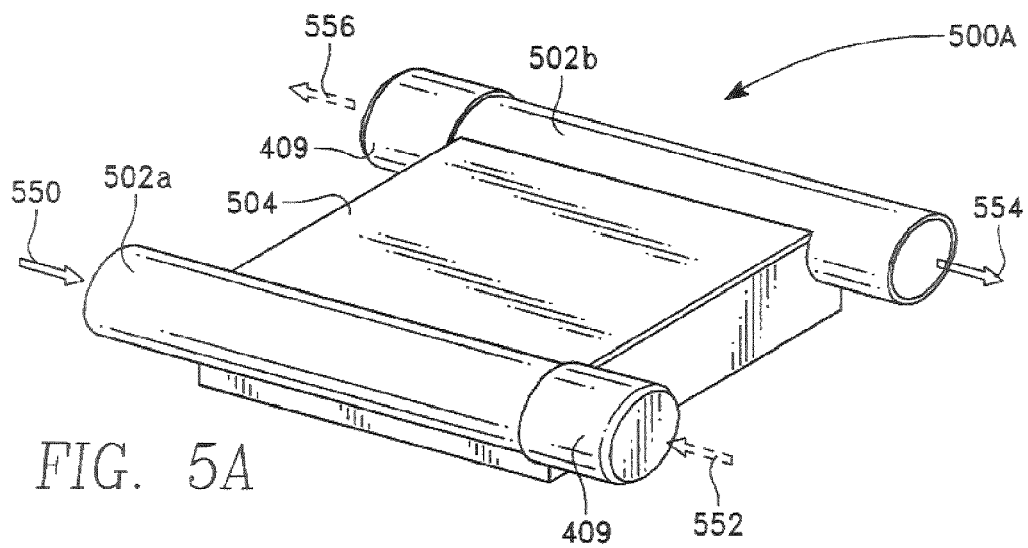
FIGS. 5A-B are diagrams of a second heat-exchanger for use with the cooling system of FIG. 1A.

In an embodiment, a unidirectional flow heat exchanger 500A shown in FIG. 5A cools the item to be cooled 116. The heat exchanger includes a gas inlet tube 502a, a gas outlet tube 502b, a finned base 506, 508 and a sealing wall or cover 504.

Figure 5B:
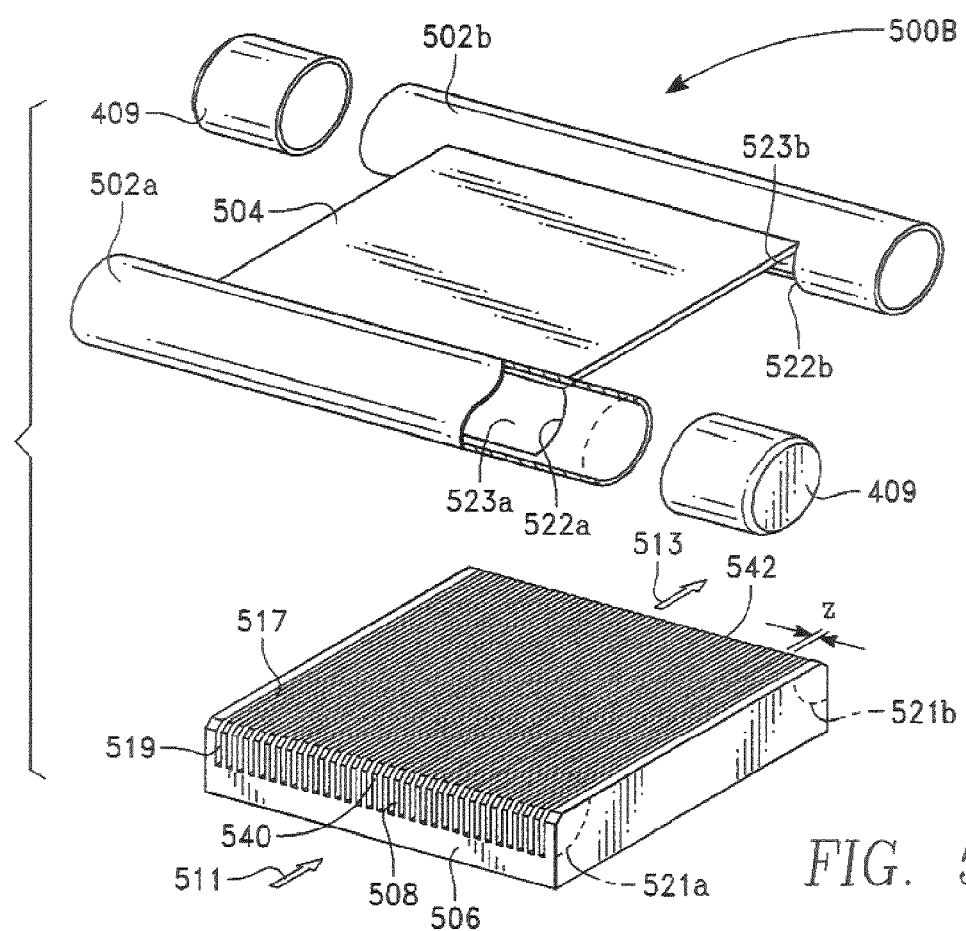

FIG. 5B shows the finned base 500B including fins 508 extending from an interface structure 506 in a heat conduction path between the item to be cooled 116 and the fins 508. In some embodiments, a block of material suitable for conducting heat, such as a block of aluminum, is worked by sawing, wire EDM, laser cutting, grinding or another suitable method to form the fins. In other embodiments, a finned interface structure may be formed in a molding process. And, in still other embodiments, a plurality of separate fins are joined to the base using one or more methods known in the art such as glues, adhesives and molten materials such as molten metal including new metal and no new metal processes such as soldering and spot welding respectively.

Inlet tube 502a and outlet tube 502b abut opposed edges of the sealing wall 504 such that the tube and wall assembly, when placed over the fins 508 closes the otherwise open channels 517 between the fins. Multiple gas paths are thereby formed between the fins 519.

Opposed edges of the heat exchanger are an inlet and outlet respectively of the gas paths 540, 542. The inlet 540 provides an entry for gas 511 leaving a region of the inlet tube or manifold 502a where a portion of the tube wall is cut-away to form a gas outlet slot 523a. This slot is bounded by opposed inlet tube rim portions 522a arranged for sealing with peripheral portions of the heat exchanger 521a.

The outlet 542 provides an outlet for gas 513 leaving a region of the outlet tube or collector 502b where a portion of the tube wall is cut-away to form a gas outlet slot 523b. This slot is bounded by opposed outlet tube rim portions 522b arranged for sealing with peripheral portions of the heat exchanger 521b.

One or two gas flows supply gas to the heat exchanger via the inlet tube 550, 552 and one or two gas flows carry gas away from the heat exchanger via the outlet tube 554, 556. In various embodiments, one or more caps 409 are used to block either end inlet and/or outlet tubes where a single gas flow will be used.

To enhance convective heat transfer, a gap "z" between adjacent fins is chosen to disturb the boundary layer commonly found in fluid systems and to thereby improve the convective heat transfer coefficient. The inventor has performed experiments and found that gaps less than $50/1000$'s of an inch are preferred and that gaps between 5 and $20/1000$'s of an inch are more preferred.

During cooling system operation, a gas compressor 106 pressurizes a gas 108 and a gas conveying system 110 delivers the compressed gas to a heat exchanger 118 thermally coupled to an item to be cooled 116. The gas absorbs heat as it passes through the heat exchanger. In some embodiments, heated gas is reused after it is cooled. In other embodiments, the heated gas is discharged to one or more of a) the environment as it leaves the heat exchanger, b) a location outside an enclosure housing the item to be cooled, c) a location outside a conditioned space containing the item to be cooled, or d) to another suitable location.

During compressor operation, blades 212, 312 are rotated inside a compressor chamber 206-210-208, 306-310-308 when a rotatable shaft coupled to the blades is turned 203, 303. Because the centerline of the shaft 220, 320 is eccentrically mounted with respect to a compressor chamber circumferential wall 210, 310 the blade tips 212, 312 seal against, rotation of the shaft causes the orientation of the blades with respect to the hub to change. In various embodiments of the flexible blade compressor, the blades flex near the blade root 214 and in various embodiments of the articulating blade compressor the blades pivot, largely without flexure, near the blade root 314.

Cavities 250, 350 formed between adjacent blades expand and contract during compressor operation, the expansion of a cavity indicating a time during which gas is drawn into the compressor and contraction of a cavity indicating a time during which gas is expelled from the compressor. In some embodiments, apertures in the sidewalls serve as compressor inlet and exhaust ports 216-218, 316-318. In other embodiments apertures in the compressor chamber circumferential wall 378, 380 serve as compressor inlet and exhaust. In yet other embodiments, both side wall and circumferential wall ports are used.

In various compressor embodiments, the blade tip seal with a mating portion of a circumferential wall 248, 349 is enhanced by centrifugal force which "throws" the blade 212, 312 against the wall with increasing force as the shaft speed increases. In some embodiments, the blade 212, 312 is weighted and/or the blade weight is preferentially distributed to move a blade center of gravity 283, 383 closer to the blade's tip 249, 349 thereby increasing the compressor's output pressure capabilities. The term blade tip refers here to the region of the blade near its distal end.

In some embodiments, a blade 212, 312 may be preferentially weighted toward its tip 249, 349 and relatively lightweight elsewhere. This configuration manages, within suitable design limits, the centrifugal forces the blades exert on the hub 201, 301 and blade coupling to the hub (such as blade roots 214, 314) while maintaining an adequate and/or improved tip seal sufficient to achieve a selected compressor outlet pressure. In an embodiment, a blade is preferentially weighted toward its tip, moving a blade center of gravity 283, 382 to a location between the blade tip or blade distal end and a lengthwise midpoint 281, 381 of the blade for maintaining an adequate and/or improved tip seal while managing the centrifugal forces the blade exerts on the hub and blade coupling to the hub.

In an embodiment, during heat exchanger 118 operation, compressed gas 110 enters the heat exchanger and flows through a plurality of passages or channels. In some embodiments a plurality of channels each have small gaps z between opposed surfaces for the purpose of disturbing a boundary layer and enhancing convective heat transfer. Heat exchangers of the present invention are useful in various embodiments for cooling items to be cooled 116 including microprocessors and other electronic devices. A similar embodiment utilizing induced flow is explained below.

As persons of ordinary skill in the art will appreciate, other embodiments of this invention can be based on induced flow through the heat exchanger 118 rather than forced flow. The driving force for gas flow through the heat exchanger is gas differential pressure across the heat exchanger. As the differential pressure rises, so the flow rate increases absent some intervening event or physical limitation such as choked flow. In this embodiment, the compressor 106 or a similar device becomes a vacuum pump when an inlet to the device, such as the compressor suction conduit 105, is used to induce rather than to force a gas flow.

Figure 6:
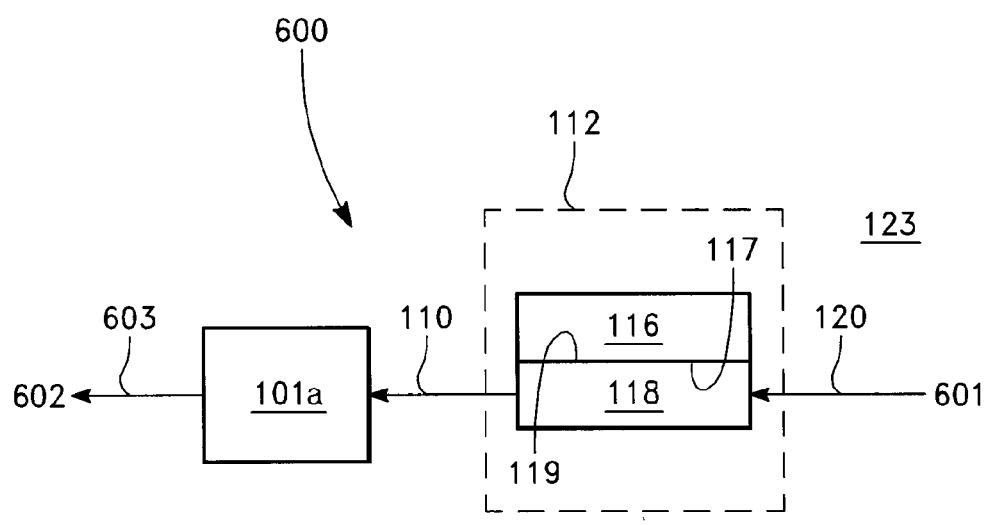
FIG. 6 is a second schematic of a cooling system in accordance with the present invention.

FIG. 6 shows an embodiment of the present invention utilizing induced flow through the heat exchanger 600. Since it is the absolute value of pressure difference that motivates gas flow, the gas source 101 pressurizing an inlet of the heat exchanger can be replaced with a gas sink 101a depressurizing an outlet of the heat exchanger. Here, a gas sink, such as a vacuum pump inlet or compressor inlet 216, reduces the pressure at an outlet of the heat exchanger via the first conduit 110 and has an exhaust 602 via a conduit 603. In response, gas is drawn into a heat exchanger inlet via the second conduit 120 from a gas supply 601. In various embodiments, the exhaust 602 and gas supply 601 are located in any of a housing enclosing the item to be cooled 116, in a conditioned space such as space 112 and external to the housing and conditioned space such as out-of-doors. In an embodiment, the exhaust 602 is located out-of-doors and gas supply 601 is drawn from a conditioned space. And, in an embodiment, the heat rejected by the device to be cooled is rejected to the out-of-doors.

As persons of ordinary skill in the art will understand, the present invention has many uses including cooling power dissipating devices such as electrical components, electronic components, semiconductors and processing units such as CPU's.

While various embodiments of the present invention have been described above, it should be understood that they have been presented by way of example only, and not limitation. It will be apparent to those skilled in the art that various changes in the form and details can be made without departing from the spirit and scope of the invention. As such, the breadth and scope of the present invention should not be limited by the

What is claimed is:

1. A modular cooling system comprising:
   a positive displacement compressor for pressurizing a gas to a pressure of about 0.5 to 14 pounds-force per square inch gauge pressure (psig), said positive displacement compressor having a circumferential wall;
   a compressor hub having an axis of rotation arranged eccentrically with respect to said circumferential wall;
   the hub coupled to a plurality of blades with respective blade roots;
   the distance between the root end of each blade and the hub axis remaining substantially constant during compressor operation;
   the distance between each blade tip and the hub axis cyclically changing in a substantially oscillatory fashion during compressor operation;
   a heat exchanger physically coupled to a semiconductor device;
   the heat exchanger incorporating a plurality of channels suitable for transporting the pressurized gas;
   each channel having an inlet, an outlet and at least one inside dimension in the range of about 5 to 50 one thousandths of an inch;
   a manifold in fluid communication with the channel inlets; and,
   the manifold operative to supply pressurized gas from the compressor to the channel inlets.

2. A modular cooling system comprising:
   a positive displacement compressor for pressurizing a gas to a pressure of about 0.5 to 14 pounds-force per square inch gauge pressure (psig), said positive displacement compressor having a circumferential wall;
   a compressor hub having an axis of rotation arranged eccentrically with respect to said circumferential wall;
   the hub coupled to a plurality of blades with respective blade roots;
   the distance between the root end of each blade and the hub axis remaining substantially constant during compressor operation;
   the distance between each blade tip and the hub axis cyclically changing in a substantially oscillatory fashion during compressor operation;
   a heat exchanger physically coupled to a semiconductor device;
   the heat exchanger incorporating a plurality of channels suitable for transporting the pressurized gas;
   each channel having an inlet, an outlet and at least one inside dimension in the range of about 5 to 50 one thousandths of an inch;
   a manifold in fluid communication with the channel inlets;
   the manifold operative to supply pressurized gas from the compressor to the channel inlets;
   a compressor mounted filter frame and a filter coupled to the frame;
   the filter operative to restrict passage of contaminants with a mean diameter of at least 25 one thousandths of an inch;
   a collector in fluid communication with the channel outlets;
   a conduit in fluid communication with the collector; and,
   the conduit operative to transport gas exhausted from the heat exchanger across a physical boundary separating two spaces, one of which spaces is a temperature controlled space suited for human occupancy.

3. A modular cooling system comprising:
   a positive displacement compressor for pressurizing air to a pressure of about 0.5 to 14 pounds-force per square inch gauge pressure (psig), said positive displacement compressor having a circumferential wall;
   a compressor hub having an axis of rotation arranged eccentrically with respect to said circumferential wall;
   the hub coupled to a plurality of blades with respective blade roots and respective blade tips;
   the distance between the root end of each blade and the hub axis remaining substantially constant during compressor operation;
   the distance between each blade tip and the hub axis cyclically changing in a substantially oscillatory fashion during compressor operation;
   a heat exchanger physically coupled to a semiconductor device;
   the heat exchanger incorporating a plurality of channels suitable for transporting the pressurized gas;
   each channel having an inlet, an outlet and at least one inside dimension in the range of about 5 to 50 one thousandths of an inch;
   a manifold in fluid communication with the channel inlets;
   the manifold operative to supply pressurized air from the compressor to the channel inlets;
   a compressor mounted filter frame and a filter coupled to the frame;
   the filter operative to restrict passage of contaminants with a mean diameter of at least 25 one thousandths of an inch;
   a collector in fluid communication with the channel outlets;
   a conduit in fluid communication with the collector;
   the conduit operative to transport gas exhausted from the heat exchanger across a physical boundary separating two spaces, one of which spaces is a temperature controlled space suited for human occupancy;
   articulated blade attachments at respective blade roots; and,
   a preferential weighting of the blades toward respective blade tips operative to increase an outlet pressure of the compressor.

4. The modular cooling system of claim 3 further comprising:
   a heat exchanger cover assembly including a cover, the manifold and the collector; and,
   a plurality of fins extending between the cover and a base and forming the plurality of channels.

5. The modular system of claim 4 further comprising:
   a plurality of cavities;
   each of the plurality of cavities formed by opposed faces of adjacent blades, an outer hub surface between the roots of the adjacent blades and an inner surface of the circumferential wall between seals the adjacent blades make with said inner surface;
   the volume of a cavity increasing during a first angular displacement of the hub for ingesting a gas into the cavity via a first aperture in a side wall;
   the volume of the cavity decreasing during a second angular displacement of the hub for pressurizing said gas; and,
   the gas being exhausted from the cavity via a second aperture in a side wall during a third angular displacement of the hub.

* * * * *